United States Patent [19]
Faulkner et al.

[11] Patent Number: 5,991,888
[45] Date of Patent: Nov. 23, 1999

[54] TEST CLOCK MODES

[75] Inventors: Darren R. Faulkner; Matthew P. Crowley, both of San Jose, Calif.

[73] Assignee: Advanced Micro Devices, Inc., Sunnyvale, Calif.

[21] Appl. No.: 08/938,184

[22] Filed: Sep. 26, 1997

[51] Int. Cl.⁶ .................................................. G06F 1/04
[52] U.S. Cl. ........................ 713/501; 702/120; 702/125
[58] Field of Search ...................... 395/551, 558, 395/500.05, 500.07, 500.09; 702/120, 125; 327/147, 150, 156, 159, 164, 172, 291; 331/1 R, 25, 44, DIG. 2; 713/400, 500, 503, 501, 601

[56] References Cited

U.S. PATENT DOCUMENTS

| | | | |
|---|---|---|---|
| 4,813,005 | 3/1989 | Redig et al. | 702/117 |
| 5,581,699 | 12/1996 | Casal et al. | 395/185.08 |
| 5,781,038 | 7/1998 | Ramamurthy et al. | 327/23 |

OTHER PUBLICATIONS

Digital Integrated Circuits, A Design Perspective; Jan M. Rabaey; Prentice Hall Electronics and VLSI Series; ©1996 by Prentice–Hall, Inc.; Upper Saddle River, New Jersey 07458; pp. 538–545.

*Primary Examiner*—Thomas M. Heckler
*Attorney, Agent, or Firm*—Skjerven, Morrill, MacPherson, Franklin, & Friel, L.L.P.; Kent B. Chambers

[57] ABSTRACT

An electronic system such as a processor or computer system includes circuitry that supports a plurality of clock modes. The clock modes may be used for, for example, testing for critical paths. The clock modes include a variety of clock signal variations that may be utilized such as cycle stretch clock mode, pulse or delay fault mode, and stop mode which provide substantial flexibility in support of a multitude of tests. In one embodiment, a processor of an electronic system includes test clock mode circuitry to support and utilize test clock modes without dependence on an external bypass clock signal operating at processor operational frequencies. Furthermore, the processor implements the test clock modes at full processor operational frequencies. Additionally, a phase-locked loop is utilized to synchronize test mode clock signals with a reference clock signal to, for example, facilitate realistic operational conditions and acquisition of accurate test results. Additionally, in some test clock modes, the phase-locked loop may be synchronized prior to issuing test clock signals to, for example, further support realistic processor operational conditions during, for example, testing operations.

24 Claims, 7 Drawing Sheets

TEST CLOCK MODES

BACKGROUND OF THE INVENTION

1. Field of the Invention

This invention relates to electronic systems utilizing a clock and more particularly relates to implementing one or more test clock modes.

2. Description of the Related Art

Electronic systems such as computer systems have become ubiquitous. Computer systems typically include one or more processors and a bus to connect each processor to each other, if applicable, to memory, and to various input/output devices. These components of the computer system and other computer system circuitry typically include integrated circuitry which responds to an external clock signal supplied to the processor.

One method of increasing electronic system performance involves increasing the clock frequency at which the electronic system components operate. However, as frequencies increase, it has become difficult to externally supply a clock signal at the operational frequencies of all components due to, for example, electromagnetic emission problems and input circuit reactances. Thus, the external clock frequency is typically multiplied by, for example, 2, 3, or 4 using internal processor circuitry.

In many instances, the maximum operational frequency of an electronic circuit is dictated by critical paths i.e. circuit paths where combinational delays are greater than the time allocated for data transmission at the operational frequency. Critical paths may be identified with a "debug tester" that provides known input data to a processor and compares the processor output data with expected output data. If no errors occur, the processor operational frequency may be increased by increasing the external clock frequency, and the debug test may be repeated until an error in the processor output data occurs. Once the debug tester detects an error, debugging software attempts to identify the critical path among the many paths between the input terminal and output terminal. One clock cycle is generally used to propagate data from one path to the next. Thus, N clock cycles are generally utilized for data to propagate through N paths, where N is an integer. To identify the critical path, the debugging software may manipulate the external clock input signal to slow down the clock frequency during a predetermined cycle of the N clock cycles or stretch predetermined cycles. The particular altered cycle may be repeatedly changed both in identification and characteristically according to well-known algorithms until the output data contains no errors. Once the output data is error free, the critical path associated with the altered clock cycle may be isolated.

However, as device operating frequencies continue to increase, allowing manipulation of the external clock frequency to identify critical paths has become unsuitable for many high operational frequency devices.

SUMMARY OF THE INVENTION

In one embodiment, test clock mode circuitry is implemented in an integrated circuit to provide multiple test clock modes for, for example, integrated circuit debugging operations. The test clock mode circuitry includes any combination of cycle stretching mode circuitry, stop clock mode circuitry, and pulse clock mode circuitry. The test clock circuitry may modify a clock output signal of a phase-locked loop, and the test clock output signals of the test clock mode circuitry may be phase locked to a reference signal to, for example, provide integrated testing circuitry which is functional at device operational speeds. In another embodiment, testing methods may, in any combination, utilize the multiple test clock modes generated by the test clock mode circuitry and a phase lock loop to, for example, test circuitry integrated with the test clock mode circuitry.

BRIEF DESCRIPTION OF THE DRAWINGS

Features appearing in multiple figures with the same reference numeral are the same unless otherwise indicated.

DETAILED DESCRIPTION OF THE PREFERRED EMBODIMENTS

The following description of the invention is intended to be illustrative only and not limiting.

The following abbreviations are used herein unless otherwise indicated:

PCLK=processor clock signal PCLK;

BCLK=reference clock signal BCLK; and

PCLKXX=a signal having only the designated "XX" state of processor clock signal PCLK, where "XX" is a numerical designation.

Clock signal variations from a conventional steady-state periodic clock may be useful in testing clocked electronic circuitry such as processors or other circuitry in, for example, an electronic system. A variety of clock signal variations referred to as test clock modes may be utilized such as cycle stretch mode, pulse or delay fault mode, and stop mode which provide substantial flexibility in support of a multitude of testing purposes. In one embodiment, a processor of an electronic system includes test clock mode circuitry to support and utilize test clock modes without dependence on a bypass clock signal attempting to operate at actual high frequency device speeds. Providing this "on-chip" capacity for implementing various test clock mode circuitry allows test clock modes to be flexibly selected to engage in numerous different, for example, testing profiles. Additionally, implementing test clock mode circuitry on-chip allows testing at full device clock speeds. In one embodiment, a processor implements test clock modes using integrated circuitry, and the test clock mode circuitry is operational at full processor frequencies. Additionally, a phase-locked loop is utilized to synchronize test mode clock signals with a reference clock signal to, for example, facilitate realistic operational conditions and acquisition of accurate test results. Additionally, in some test clock modes, the phase-locked loop may be synchronized prior to issuing test clock signals thus helping insure well-defined clock signals during all phases of operation.

Figure 1:
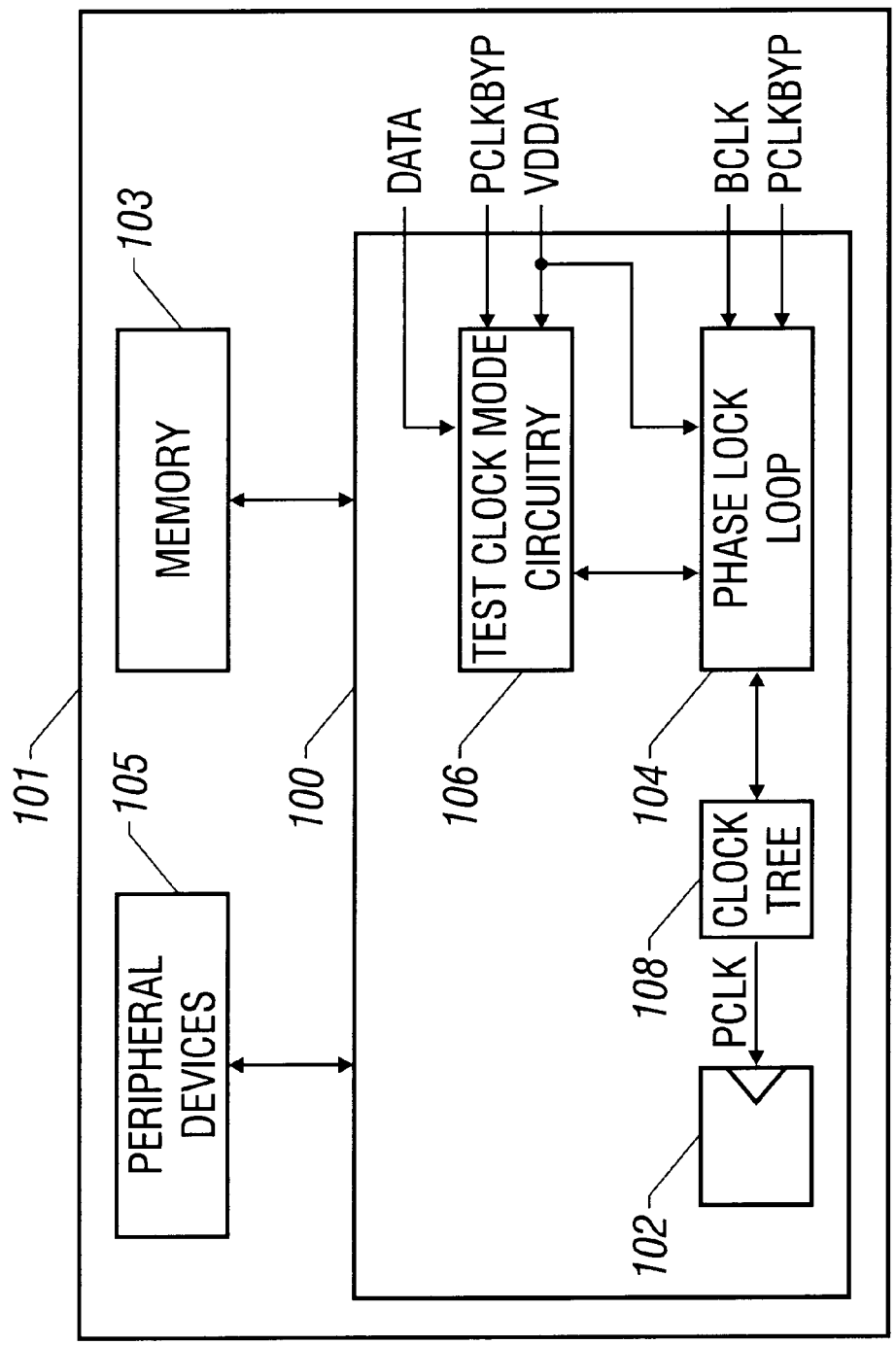
FIG. 1 is an electronic system having a microprocessor with a phase-locked loop and test clock mode circuitry.

Referring to FIG. 1, an electronic system 101 includes a processor 100 connected to a memory 103 and peripheral devices 105, which may be, for example, any input/output devices. Processor 100 includes circuitry 102 having, for example, edge triggered latches that respond to clock signals received from phase-locked loop 104. Processor 100 may be any processor such as a microprocessor manufactured by Advanced Micro Devices of Sunnyvale, Calif. In normal operation, the phase-locked loop 104 and clock tree 108 provide a periodic output PCLK to circuitry 102 in phase with an externally received periodic BCLK. The PCLK frequency is generally a multiple of the BCLK signal, which may, for example, be 100 MHz. For example, the PCLK may be a 3x signal of the BCLK, i.e. three times the frequency of BCLK. VDDA is a filtered voltage source signal provided by an external power supply (not shown).

During test operations, the functionality of processor 100 may be analyzed by scanning data into processor 100 in a well-known manner. Specific clock test modes are scanned in as DATA for use by test clock mode circuitry 106. The test clock mode circuitry 106 modifies the PCLK in accordance with any of a variety of test clock modes. During normal operation, signal PCLKBYP may serve as a normal bypass clock signal. However, during clock test modes, a pulsed signal PCLKBYP may be used as a trigger signal to initiate test clock mode operations. Because the test clock mode circuitry 106 modifies the phase locked PCLK, test operations are clocked with a well-defined processor clock signal that realistically simulates actual processor 100 operation at actual processor 100 operating frequencies.

Figure 2:
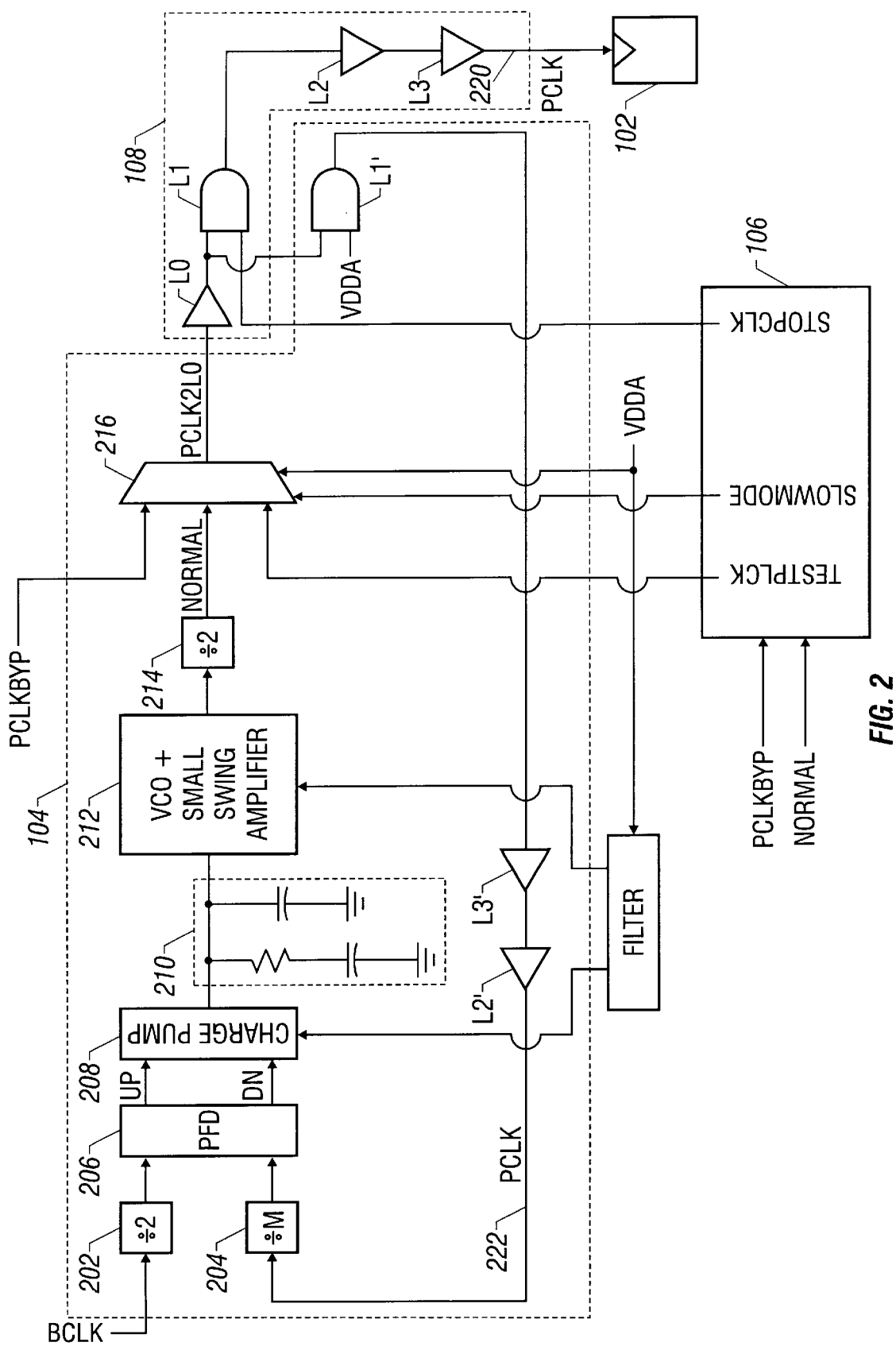
FIG. 2 is an embodiment of the phase-locked loop and test clock mode circuitry of FIG. 1.

Referring to FIG. 2, the BCLK may be a bus clock signal and is, thus, generally an M/2 multiple of the PCLK, where M may be, for example, five. One-half integer multiplication unit 202 divides BCLK by two, and divide by M unit 204 divides PCLK by M so that phase-frequency detector (PFD) 206 accurately detects any phase difference between BCLK and clock signal PCLK. The PFD 206 provides UP and DN (down) signals to charge pump 208 when PCLK lags and leads, respectively, BCLK. Low pass filter 210 filters the control voltage output signal of charge pump 208 prior to reception by voltage controlled oscillator and small swing amplifier 212. Voltage controlled oscillator and small swing amplifier 212 adjust their output clock signal in a well-known manner in accordance with the control voltage output signal of charge pump 208. Another one-half integer multiplication unit 214 decreases the voltage controlled oscillator and small swing amplifier 212 output signal by one-half to generate output signal NORMAL. It will be recognized by those of ordinary skill in the art that well-known components of phase-locked loop 104 may be implemented in a multitude of well-known ways and input and output signals may have any number of desired frequencies. The UP and DN signals to charge pump 208 may be illustratively modified in accordance with the concurrently filed U.S. patent application entitled "PHASE-LOCKED LOOP WITH VARIABLE PARAMETERS", by Matthew P. Crowley and Mark G. Johnson, having attorney docket number M-5145 U.S., which is incorporated by reference herein in its entirety.

In accordance with Table 1, voltage source signal VDDA and signal SLOWMODE function as select signals to select one of three input signals, NORMAL, PCLKBYP, or TESTPLCK, for three to one (3:1) multiplexer 216 to pass through as PCLK2L0. Note that select signal SLOWMODE is the inverted version of register 302 bit SLW and is active at logical zero. The PCLK2L0 is distributed through level zero buffer L0 of clock tree 108 to input terminals of AND gate buffers L1 and L1'. When control signal STOPCLK is in the default state of logical one, PCLK2L0 propagates through buffers L1, L2, and L3 to circuitry 102. Due to propagation delays of L0, L1, L2, and L3, PCLK is a delayed version of PCLK2L0. In one embodiment, PCLK is delayed by approximately 2 ns and is approximately the inverse of PCLK2L0. AND gate buffer L1' replicates the propagation delays of AND gate buffer L1 and passes PCLK2L0 when VDDA, connected to the other input terminal of AND gate buffer L1', is a logical one. The output signal of buffer L1' is fed back to divide by M unit 204 through buffers L2' and L3' which replicate propagation delays of buffers L2 and L3, respectively. The input signal to divide by M unit 204 is, thus, PCLK, and phase-locked loop 104 maintains a phase lock between the distributed PCLK and BCLK.

TABLE 1

| select/voltage source signal VDDA | select signal SLOWMODE | multiplexer 216 output signal |
|---|---|---|
| 0 | X | PCLKBYP |
| 1 | 1 | NORMAL |
| 1 | 0 | TESTPCLK |

During normal processor 100 operation, power is supplied to processor 100 so VDDA is logical one (e.g. 2–3.3 Volts) and select signal SLOWMODE is logical zero (e.g. 0–1 V). Thus, during normal operation select signals VDDA and SLOWMODE select and multiplexer 216 provides periodic clock output signal NORMAL as PCLK.

When voltage source signal VDDA is asserted to multiplexer 216 as logic zero, regardless of the state of select signal SLOWMODE, multiplexer 216 provides signal PCLKBYP as, for example, an externally provided bypass periodic clock signal.

During processor 100 test clock mode operations, voltage source signal VDDA and select signal SLOWMODE are both set to logical one so that multiplexer 216 provides input signal TESTPCLK as PCLK. The PCLK signal is modified in accordance with input signal TESTPCLK during test clock modes to, for example, identify processor 100 critical paths, provide high resolution cessation of processor 100 operations, and allow a precise number of PCLK cycles to issue, for example, for testing purposes.

Figure 3:
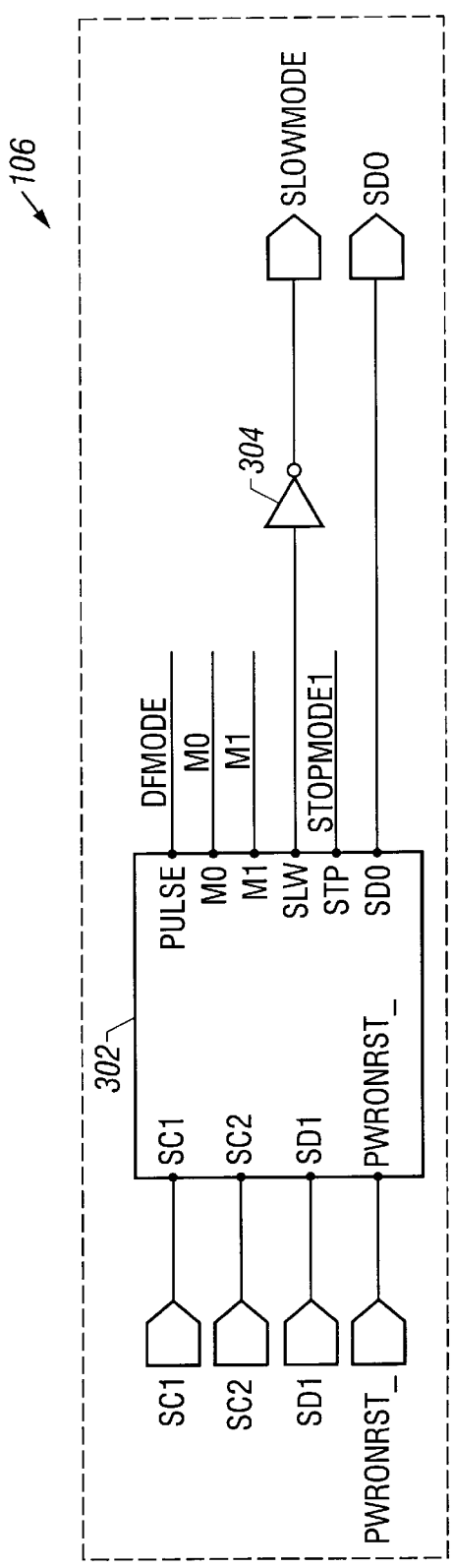
FIG. 3 is an embodiment of a register of the test clock mode circuitry of FIG. 2 for enabling various test clock modes and selecting particular processor clock signal cycles.

Referring to FIG. 3, in this more detailed embodiment of test clock mode circuitry 106, input signal DATA (FIG. 1) includes three input signals, SC1 (scan clock 1), SC2 (scan clock 2), and SDI (scan data in), which may be scanned in during test operations in a well-known manner. The input signals, SC1, SC2, and SDI are received by a register 302 which responsively sets register output signal bits PULSE, M0, M1, SLW, and STP. The settings of register 302, and voltage source signal VDDA (as shown in Table 1), determine whether processor 100 operates in normal mode or test mode, and, if in test mode, selectively enable a particular test clock mode. Table 2 shows the register 302 logical output bit settings and their corresponding meaning, and "X" indicates a 'don't care' logical state.

TABLE 2

| PULSE BIT | M0 | M1 | SLW | STP | Description |
|---|---|---|---|---|---|
| 0 | X | X | 0 | X | Normal Mode (see Table 1) |
| 1 | 0 | 0 | 0 | X | Pulse Mode, stop on PCLK00 |
| 1 | 0 | 1 | 0 | X | Pulse Mode, stop on PCLK01 |
| 1 | 1 | 0 | 0 | X | Pulse Mode, stop on PCLK10 |
| 1 | 1 | 1 | 0 | X | Pulse Mode, stop on PCLK11 |
| 0 | * | * | 1 | 0 | Cycle stretch test clock mode. *M0 and M1 bits are set so that all PCLK cycles occurring within a BCLK period are stretched (see Table 3). |
| 0 | 0 | 0 | 1 | 1 | Stop mode, select PCLK00 |
| 0 | 0 | 1 | 1 | 1 | Stop mode, select PCLK01 |
| 0 | 1 | 0 | 1 | 1 | Stop mode, select PCLK10 |
| 0 | 1 | 1 | 1 | 1 | Stop mode, select PCLK11 |

Figure 4:
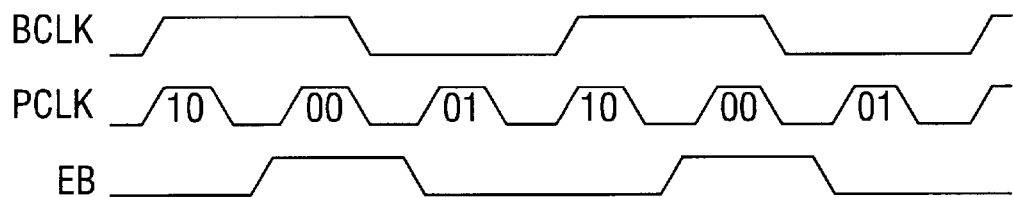
FIG. 4 is a timing diagram illustrating processor clock signal identification.

Referring to FIGS. 3 and 4, the register 302 bit SLW sets the multiplexer 216 select signal SLOWMODE through inverter 304. The register 302 settings of register match bits M0 and M1 identify a particular PCLK cycle within a BCLK period. The active M0 and M1 states describe a PCLK cycle which allows clock test mode operations to both start and stop in a deterministic manner. Since two match bits are supported, up to four PCLK cycles are uniquely defined for each BCLK cycle. It will be understood by persons of ordinary skill in the art that additional Mx bits may be added to support higher PCLK/BCLK frequency ratios.

In the embodiment of FIG. 4, a 3× PCLK is synchronized with BCLK. Each of the PCLK cycles for each BCLK cycle is designated 10,00, and 01, and the states of match bits M0 and M1 identify the least significant bit and most significant bit, respectively, of each PCLK cycle designation, i.e. M1=1 and M0=0 identify all of the designated "10" states of PCLK. For convenience, each of the signals with states "XX" of PCLK are referred to as PCLKXX.

Figure 5:
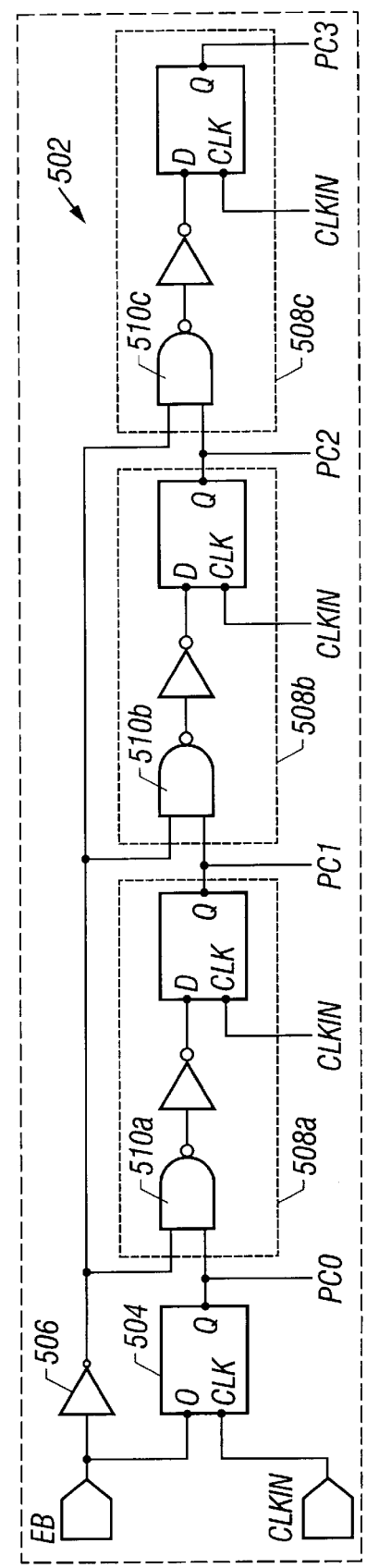
FIG. 5 is an embodiment of a processor clock signal state identifier for the test clock mode circuitry of FIG. 2.
Figure 6:
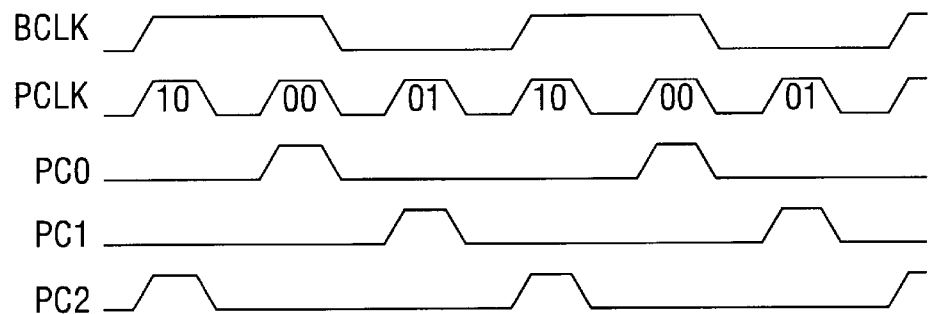
FIG. 6 is a timing diagram representing processor clock state identification signals.

Referring to FIGS. 4, 5, and 6 test clock mode circuitry 106 includes PCLK state identifier circuitry 502 which provides an output signal that identifies a particular PCLKXX cycle. As described below, PCLK state identifier circuitry 502 has four output signals PC0, PC1, PC2, and PC3 that mirror PCLK00, PCLK01, PCLK10, and PCLK11.

Periodic initialization signal EB rises after alignment of BCLK and PCLK to provide an initialization point for PCLK state identifier circuitry 502. The periodic initialization signal EB falls after one period of PCLK. Clock signal CLKIN has the same frequency as the PCLK but is not phase aligned with the PCLK. When periodic initialization signal EB rises, a clock signal CLKIN will rise while periodic initialization signal EB is high (logical one). Periodic initialization signal EB is asserted at the D input terminal of D flip-flop 504, and, when periodic initialization signal EB rises and clock signal CLKIN is asserted as a logic one, the Q output terminal of D flip-flop 504 acquires the logic level at the D input terminal. The output signal of the D flip-flop 504 Q output terminal is designated signal PC0. Signal PC0 approximately mirrors PCLK00, and, thus, signal PC0 represents the state of and identifies PCLK00.

Each register logic circuit 508a, 508b, and 508c includes a NAND gate coupled through an inverter to a D input terminal of a D flip-flop, and the inverter 506 is coupled to an input terminal of each NAND gate 510a, 510b, and 510c. Each register logic circuit 508a, 508b, and 508c is clocked with clock signal CLKIN, and, thus, when periodic initialization signal EB is high, the Q output terminals of register logic circuits 508a, 508b, and 508c, respectively, are low (logical zero). The other terminal of NAND gates 510a, 510b, and 510c are coupled to the Q output terminal of preceding D flip-flop 504 and register logic circuits 508a and 508b, respectively. Thus, during one BCLK period, the state of each Q output terminal is shifted to the successive register logic circuit 508a, 508b, and 508c Q output terminal during each cycle of clock signal CLKIN. Another periodic initialization signal EB period begins with a new BCLK period, and the shifting process begins again.

The respective Q output terminals of register logic circuits 508a, 508b, and 508c conduct signals PC1, PC2, and PC3 respectively. The state shifting of D flip-flop 504 and register logic circuit 508a, 508b, and 508c causes signals PC1, PC2, and PC3 to respectively have the same state of and, thus, identify PCLK01, PCLK10, and PCLK11. FIG. 6 illustrates BCLK, a 3× PCLK, and corresponding identification signals PC0, PC1, and PC2. PC3 is used to represent PCLK11 when a 4× PCLK is generated.

Cycle Stretch Test Clock Mode

The cycle stretch test clock mode may be used to search for the exact cycle when an internal processor 100 critical path failure occurs. To keep phase-locked loop 104 in lock during cycle stretching, all PCLK cycles within a BCLK cycle will be stretched by a factor of N, where N is an integer and is, for example, two. Thus, searches are generally limited in resolution to one BCLK cycle when keeping the phase-locked loop 104 in period lock. Additionally, multiple sets of stretched PCLK cycles may be issued while maintaining lock with the BCLK because synchronization is not lost during cycle stretching.

During cycle stretch test clock mode, voltage source signal VDDA and select signal SLOWMODE are set in accordance with Table 1 so that test clock mode circuitry 106 output signal TESTPCLK is passed through multiplexer 216 as PCLK and distributed to the clocked circuitry of processor 100.

Figure 7:
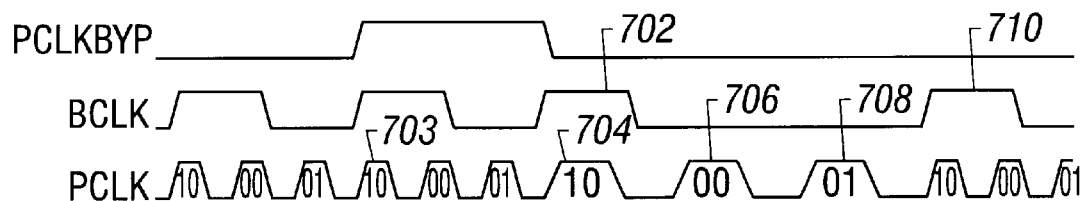
FIG. 7 is a timing diagram representing a cycle stretching test clock mode.

Referring to FIG. 7, when PCLK cycles are illustratively doubled beginning with BCLK cycle 702, three PCLK cycles 704, 706, and 708 are stretched by a factor of two. The BCLK cycle 702 period is also doubled by 'swallowing' or removing the state transition of BCLK 702 that would otherwise occur between BCLK cycles 702 and 710. Because BCLK is generated externally to processor 100, the BCLK generator (not shown) may be, for example, programmed to increase the period of BCLK cycle 702 by the same factor N denominating the PCLK cycle stretching factor. By maintaining the ratio of BCLK cycles to PCLK cycles and maintaining the BCLK and PCLK00 synchronized rising edge transition, the phase-locked loop 104 maintains phase lock.

Figure 8:
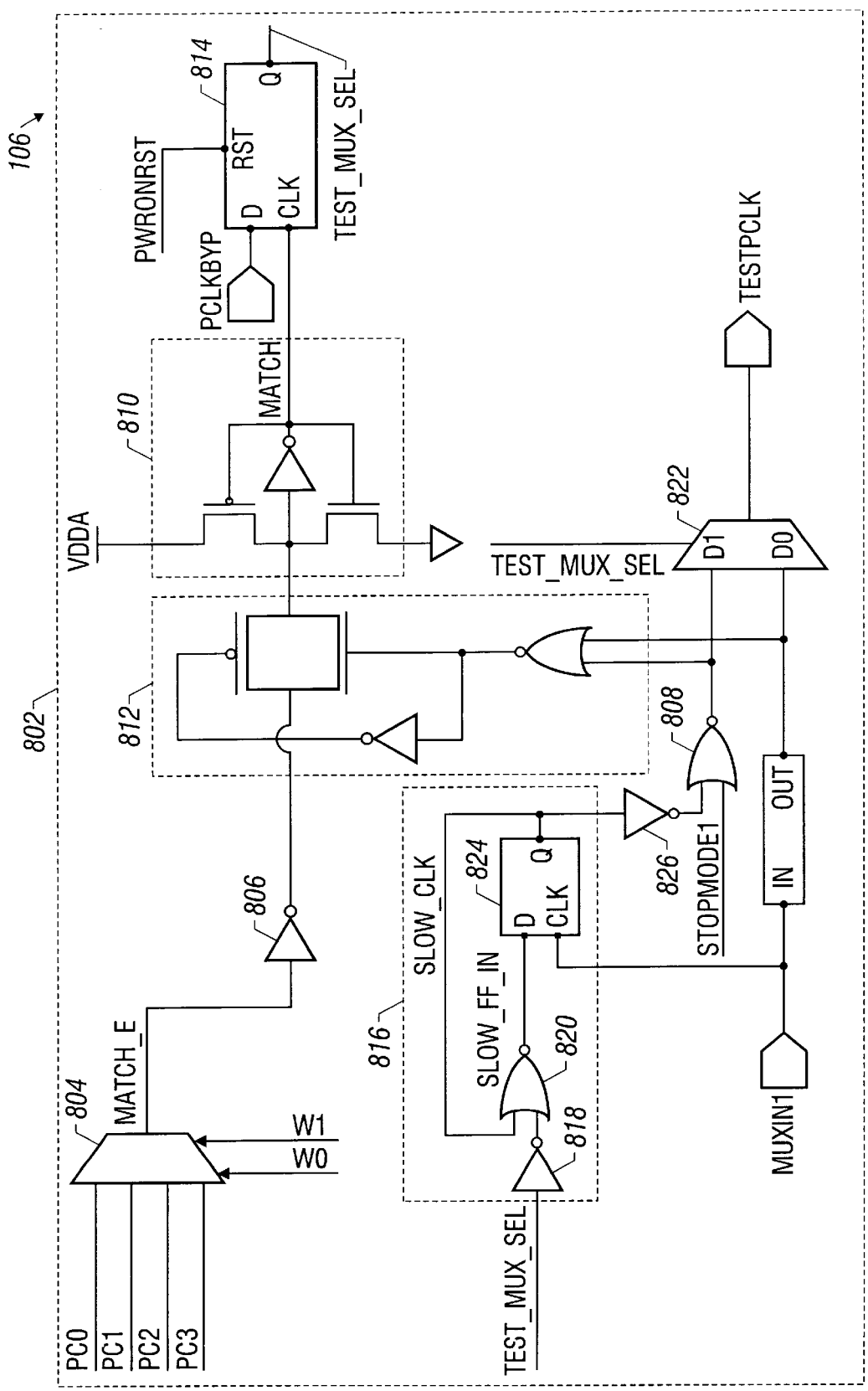
FIG. 8 illustrates an embodiment of stop mode and cycle stretching mode implementation circuitry.

Referring to FIG. 8, an embodiment of stop mode and cycle stretching mode implementation circuitry 802 of test clock mode circuitry 106 includes four to one multiplexer 804. Match bits M0 and M1 select the input identification signal PC0, PC1, PC2, or PC3 to be passed through by multiplexer 804 in accordance with Table 3.

TABLE 3

| M0 | M1 | Multiplexer 804 output signal MATCH_E |
|---|---|---|
| 0 | 0 | PC0 |
| 0 | 1 | PC1 |
| 1 | 0 | PC2 |
| 1 | 1 | PC3 |

Note that when utilizing a three to one PCLK to BCLK ratio, M0=1, M1=1, and signal PC3 are not used.

Referring to FIGS. 7 and 8, in cycle stretching test clock mode, match bits M0 and M1 are set so that the selected identification signal PCx selected corresponds to the PCLK cycle PCLKXX having a rising edge aligned with the rising edge of the BCLK. Thus, when utilizing a 3× PCLK, match bits M1 and M0 are set to 10b (b-binary), respectively, to select signal PC2 corresponding to PCLK10. Signal MATCH_E is inverted by inverter 806, synchronized with coincident logical zero levels of clock signal MUXIN1 and the output signal of NOR gate 808 by synchronization circuit 812, and latched by cross-coupled inverter latch 810. The latched signal of latch 810 is designated sample signal MATCH and is applied to the clock input terminal of D flip-flop 814. During all test clock modes, PCLKBYP need only be asserted high during a MATCH signal transition from logical one to logical zero. To ensure that PCLKBYP is asserted during this MATCH signal transition, PCLKBYP may be asserted high during an entire BCLK cycle during which a MATCH signal will transition from logical zero to logical one.

After the DATA signals have been scanned into register 302, the phase-locked loop 104 continues to operate in the normal mode until a trigger signal PCLKBYP is received and sampled by D flip-flop 814. Referring to FIG. 7, for the cycle stretch test clock mode, trigger signal PCLKBYP is asserted during the PCLK10 pulse 703 to initiate the cycle stretch test clock mode. The rising edge of sample signal MATCH will cause D flip-flop 814 to sample a logical one trigger signal PCLKBYP when trigger signal PCLKBYP is asserted. Cycle stretching begins at the beginning of the next BCLK cycle immediately following the BCLK during which trigger signal PCLKBYP is asserted. For example, in FIG. 7, trigger signal PCLKBYP is asserted during BCLK cycle 712, and cycle stretching begins with PCLK10 pulse 703 at the beginning of BCLK cycle 702.

After sampling of trigger signal PCLKBYP, the Q output terminal maintains a logical one test select signal TEST_MUX_SEL until trigger signal PCLKBYP is sampled again at a logic low level. Note that by continuing to assert a logical high trigger signal PCLKBYP when sample signal MATCH is asserted high, cycle stretch test clock modes can be initiated in accordance with any pattern such as sequential cycle stretch test clock modes and alternating cycle stretch test clock modes. It will also be noted that select signal TEST_MUX_SEL defaults to logical zero when trigger signal PCLKBYP is sampled at logical zero. Reset signal PWRONRST sets select signal TEST_MUX_SEL to logical zero during power up initialization. When asserted, the D flip-flop 814 PWRONRST signal causes the Q output terminal of D flip-flop 814 to obtain a logical zero level.

When select signal TEST_MUX_SEL is a logical zero, a logical one is asserted by inverter 818 on an input terminal of NOR gate 820. Thus, select signal TEST_MUX_SEL forces the output terminal Q of frequency divider 816 to a logic zero level during every cycle of clock signal MUXIN1. Clock signal MUXIN1 is essentially the output signal NORMAL from one-half integer multiplication unit 214. At a logic zero level, select signal TEST_MUX_SEL selects the D0 input terminal of two to one multiplexer 822, and multiplexer 822 allows clock signal MUXIN1 to pass through as output signal TESTPCLK.

During cycle stretch test clock mode, inverter 818 inverts the logical one select signal TEST_MUX_SEL and, thus, the frequency divider 816 output signal SLOW_CLK determines the state of D flip-flop 824 input signal SLOW_FF_IN. When clock signal MUXIN1 transitions to a logical one, output signal SLOW_CLK obtains the state of input signal SLOW_FF_IN at the D input terminal of D flip-flop 824. Thus, when select signal TEST_MUX_SEL is a logical one, frequency divider 816 divides the frequency clock signal MUXIN1 by two. Initially, output signal SLOW_CLK is zero, and input signal SLOW_FF_IN is a logical one.

Referring to Table 2 and FIGS. 7 and 8, during the cycle stretch test clock mode, register 302 bit STP and, thus, mode control output signal STOPMODE1 are set to a logical zero. With output signal STOPMODE1 set to logical zero and applied to an input terminal of NOR gate 808, the inverted output signal SLOW_CLK from inverter 826 determines the output signal state of NOR gate 808. Thus, NOR gate 808 propagates output signal SLOW_CLK to the D1 input terminal of 822 until trigger signal PCLKBYP is sampled at a logic zero state, and multiplexer 822 passes output signal SLOW_CLK through as output signal TESTPCLK. In this embodiment PCLK cycles 704, 706, and 708 are the propagated output signal SLOW_CLK.

Stop Test Clock Mode

The stop test clock mode allows processor 100 to operate at any phase-locked loop 104 PCLK frequency and then be stopped precisely upon assertion of trigger signal PCLKBYP. The stop test clock mode has a stopping resolution of one PCLK cycle.

Referring to FIGS. 3 and 8, to enable the stop test clock mode, the register 302 register bit STP is set to a logical one which causes output signal STOPMODE1 to obtain a logic one level. The particular PCLKXX to stop on is selected by setting match bits M0 and M1 in accordance with Table 2. Once the match bits M0 and M1 are appropriately set, latch 810 will latch sample signal MATCH with the value of PCLK identification signal PCx, where PCx corresponds to the selected stopping PCLKXX.

Figure 9:
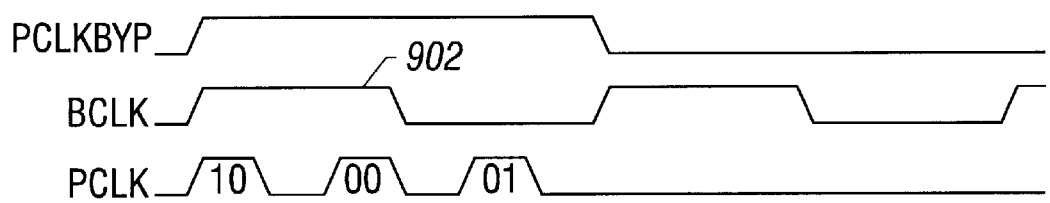
FIG. 9 is a timing diagram representing a stop clock test clock mode.

Referring to FIGS. 8 and 9, trigger signal PCLKBYP is sampled by D flip-flop 814 on a rising edge of sample signal MATCH as described above. To stop PCLK on a particular cycle, trigger signal PCLKBYP is asserted so that the rising edge of sample signal MATCH samples a high trigger signal PCLKBYP during a BCLK cycle that corresponds to the selected PCLKXX. To ensure adequate set up and hold times, trigger signal PCLKBYP may be asserted during the entire BCLK cycle that corresponds to the selected PCLKXX. In the embodiment of FIG. 9, the PCLK01 pulse in BCLK period 902 is selected as the stopping PCLK cycle. Thus, in this embodiment, match bits M1 and M0 are set to 01b, respectively, and identification signal PC2 is passed through multiplexer 804 and latched by latch 810 after synchronization with clock signal MUXIN1 and the output signal of NOR gate 808 by synchronization circuit 812. On the rising edge of sample signal MATCH, select signal TEST_MUX_SEL rises to a logic level one and selects the D1 input terminal of multiplexer 822. Since the output signal STOPMODE1 is set to logic level one during stop test clock mode, the output signal of NOR gate 808 becomes a logical zero. Thus, test clock mode circuitry 106 output signal TESTPCLK becomes a logical zero. Referring to FIG. 2, multiplexer 216 passes output signal TESTPCLK which becomes a logic zero PCLK before the next PCLK10 pulse issues.

Pulse Test Clock Mode

The pulse test clock mode allows distribution of a predetermined number of PCLK cycles to processor 100 circuitry. Pulse test clock mode provides selected, highly predictable PCLK cycles to processor 100 circuitry at full processor 100 frequencies.

Figure 10:
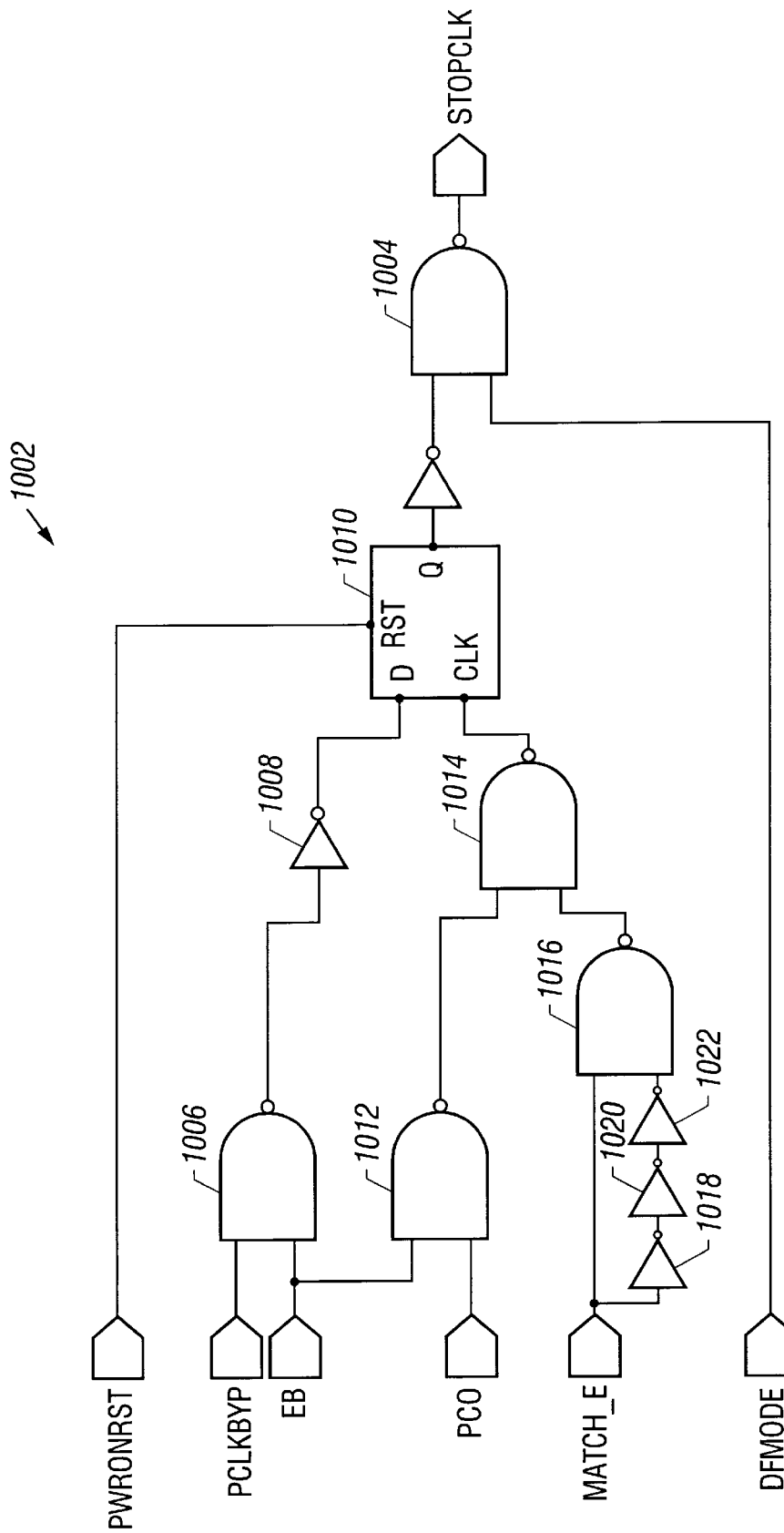
FIG. 10 illustrates an embodiment of pulse test clock mode implementation circuitry of the test clock mode circuitry of FIG. 2.

Referring to FIGS. 3 and 10, the pulse test clock mode is enabled by scanning bit state DATA into register 302 in accordance with implementation of the Pulse Mode in Table 2. When the PULSE bit of register 302 is set to logical one, output control signal DFMODE follows and applies a logical one to an input terminal of NAND gate 1004 of pulse mode circuitry 1002. Thus, the other input terminal of NAND gate 1004 controls the NAND gate 1004 output signal STOPCLK during pulse test clock mode.

Referring to FIGS. 2 and 10, once the pulse test clock mode is enabled and by controlling the signal STOPCLK at the input terminal of AND gate buffer L1, pulse mode circuitry 1002 allows selected PCLK cycles to propagate past AND gate buffer L1 to circuitry 102. Since voltage source signal VDDA is a logical one during pulse test clock mode, PCLK2L0 continues to propagate through AND gate buffer L1' and buffers L2' and L3', unaffected by the state of signal STOPCLK. Thus, regardless of the state of signal STOPCLK and the corresponding selected pulse transmission through clock tree 108, phase-locked loop 104 maintains phase lock between PCLK and BCLK.

Referring to FIGS. 2, 5, 8, 10, and 11, the D flip-flop 1010 is clocked at the rising edge of identification signal PC0 and at a logical zero to logical one transition of signal MATCH_E. Periodic initialization signal EB and identification signal PC0 have logical one states that overlap during test clock mode operations. Thus, the logical zero output signal of NAND gate 1012 during this overlap event forces the output signal of NAND gate 1014 and D flip-flop 1010 CLK input terminal to logical one. Accordingly, the D flip-flop 1010 is always clocked with the rising edge of identification signal PC0. Additionally, a logical zero to logical one transition of signal MATCH_E temporarily changes the states of the NAND gate 1016 input terminals from 01b to 11b. This momentary state change is of sufficient duration due to the propagation delays of serially connected inverters 1018, 1020, and 1022 at an input terminal of NAND gate 1016, to produce a logic one at the D flip-flop 1010 CLK input terminal. Thus, the D flip-flop 1010 is also always clocked at the logical zero to logical one signal MATCH_E transition.

The signal PCLKBYP is utilized as a trigger signal during pulse test clock mode to initiate PCLK pulse transmission to circuitry 102. If trigger signal PCLKBYP is logical zero at an input terminal of NAND gate 1006, the output terminal of NAND gate 1006 is forced to logical one regardless of the state of periodic initialization signal EB. Thus, once the output signal of NAND gate 1006 is passed through inverter 1008, the D-input terminal of D flip-flop 1010 is driven to logical zero. When the D flip-flop 1010 CLK input terminal receives a logical one, the state of the D flip-flop 1010 Q-output terminal obtains the state of the D-input terminal.

The number of pulses transmitted to clock tree 108 is determined by the match bits M0 and M1 of register 302 and the duration of trigger signal PCLKBYP. Table 4 describes the correlation between the number of pulses transmitted during a BCLK cycle and match bits M0 and M1 for a 4× PCLK. For a 3× PCLK, signal MATCH_E equal to signal PC3 is not used and PCLK11 is not available for transmission. The PCLK pulses transmitted to circuitry 102 in accordance with Table 4 may be repeated any number of times by asserting a logical one trigger signal PCLKBYP during each BCLK period when pulse trains are desired. Fully synchronized pulses repeated at any desired interval or intervals are possible because, for example, the AND gate buffer L1' and buffers L2' and L3' provide an independent feedback path for phase-locked loop 104 that maintains phase synchronization between PCLK and BCLK regardless of the state of signal STOPCLK. Because AND gate buffer L1 essentially receives PCLK2L0 which is an 'early' version of PCLK, a logical one asserted control signal STOPCLK allows selected PCLK2L0 pulses to pass. Thus, correlation with PCLK2L0 pulses and control signal STOPCLK actually identifies PCLK pulses selected with match bits M0 and M1.

TABLE 4

| M1 | M0 | signal MATCH_E | PCLKXX pulses transmitted |
|----|----|----|----|
| 0 | 0 | PC0 | PCLK01, PCLK10, PCLK11 and PCLK00 |
| 0 | 1 | PC1 | PCLK01 |
| 1 | 0 | PC2 | PCLK01 and PCLK10 |
| 1 | 1 | PC3 | PCLK01, PCLK10 and PCLK11 |

Figure 11:
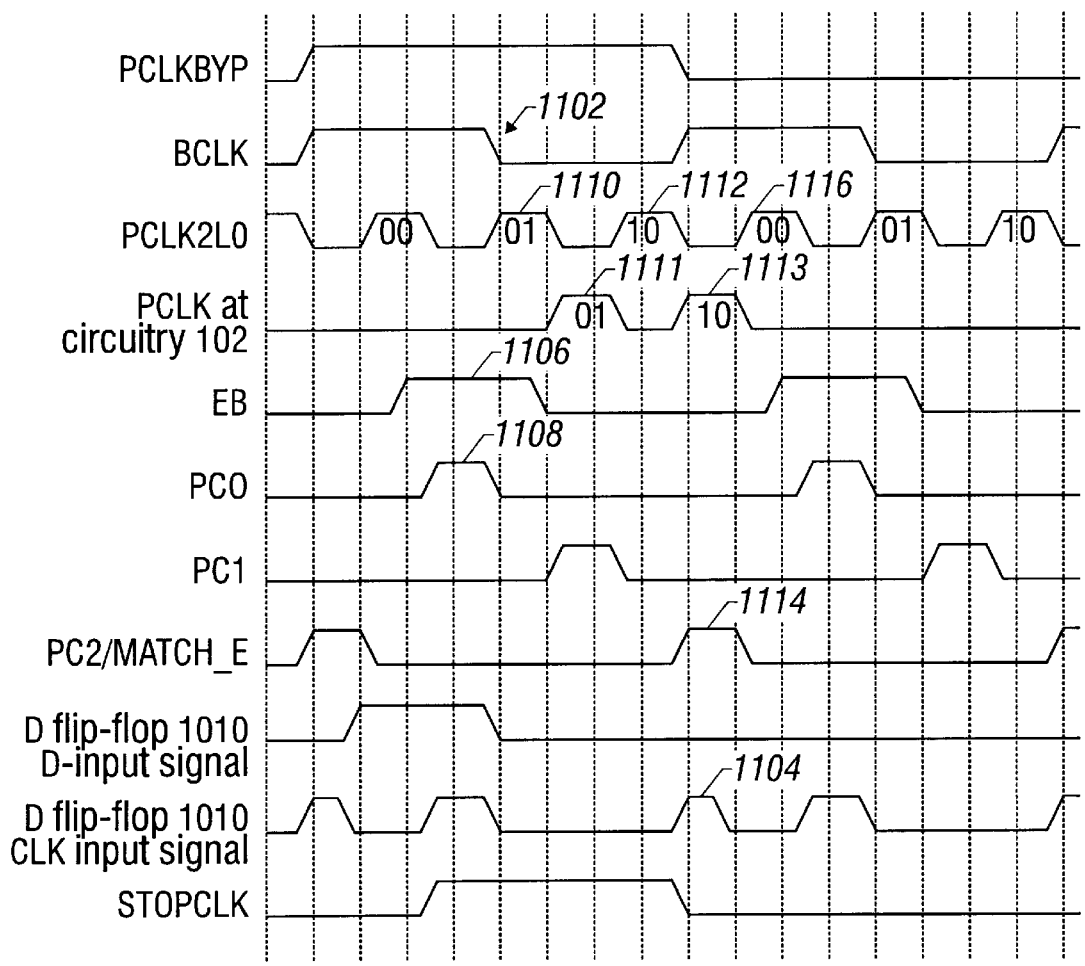
FIG. 11 is a timing diagram representing a pulse test clock mode.

Referring to FIGS. 10 and 11, to assert a predetermined number of pulses to circuitry 102, trigger signal PCLKBYP is asserted as a logical one during the BCLK period or periods when pulse trains are desired, and output signal selection control of NAND gate 1006 is passed to periodic initialization signal EB. Thus, via serially connected inverter 1008, the D input terminal of D flip-flop 1010 tracks the state of signal EB when trigger signal PCLKBYP is at logical one. After signal EB and, thus, the D input terminal of D flip-flop 1010 transition to one, the identification signal PC0 (and /or signal MATCH_E when set to PC0) will clock D flip-flop 1010. The Q-output terminal and, thus, output signal STOPCLK then transitions to logical one. The first PCLK2L0 cycle to issue after output signal STOPCLK transitions to logical one is PCLK2L0_01. Thus, during pulse test clock mode, the PCLK01 pulse 1111 is the first pulse to issue to circuitry 102.

Identification signal PC0 and periodic initialization signal EB transition to logical zero approximately simultaneously, and the D input terminal of D flip-flop 1010 tracks signal EB to obtain a logical zero. The output signal STOPCLK remains a logic one unless D flip-flop 1010 is clocked again when either trigger signal PCLKBYP or periodic initialization signal EB has a logical zero state. While signal STOPCLK remains at logic level one, PCLK2L0 cycles will issue to the output terminal of AND gate buffer L1. D flip-flop 1010 will be clocked prior to the rising edge of the next signal EB cycle unless match bits M1 and M0 set to 00b to set signal MATCH_E equal to signal PC0. Once signal STOPCLK obtains a logic zero level, the output of AND gate buffer L1 will be logic zero.

FIG. 11 illustrates an exemplary timing diagram for a 3× PCLK with match bits M1 and M0 set to 10b, respectively. From PCLK state identifier circuitry 502 (FIG. 5), signal MATCH_E directly tracks identification signal PC2. With match bits M1 and M0 are set to 10b, respectively, the CLK input terminal clocks D flip-flop 1010 at the rising edge of signal MATCH_E which directly corresponds to identification signal PC2. According to Table 4, match bits M1 and M0 select PCLK01 and PCLK10 pulses for issuing as a pulse train to circuitry 102. Trigger signal PCLKBYP selects the particular PCLK01 and PCLK10 pulses corresponding to BCLK cycle 1102 to issue by transmitting to logic one during the BCLK 1102 period. The signal EB1106 transitions to logic level one which causes the D input terminal of D flip-flop 1010 to follow to logic one. While periodic initialization signal EB remains at logic one, identification signal PC0 cycle 1108 clocks D flip-flop 1010, and signal STOPCLK transitions to a logic level one. While signal EB and the D flip-flop 1010 D input terminal transition to logic level zero, PCLK2L0_01 1110 issues which becomes PCLK01 pulse1111. Control signal STOPCLK remains at logic level one to allow PCLK2L0_10 1112 to issue which becomes PCLK10 1113. After PCLK2L0_10 1112 issues, signal MATCH_E cycle 1114 causes D flip-flop 1010 CLK input terminal to rise to logic one 1104. Thus, signal STOPCLK acquires the logic zero from the D flip-flop 1010 D input terminal prior to prevent issuing of the subsequent PCLK2L0_00 1116 pulse to buffer L2. However, phase-locked loop 104 maintains phase lock between PCLK and BCLK because the feedback path through AND gate buffer L1' is independent of the state of signal STOPCLK.

It is evident from the timing diagram of FIG. 11, pulse mode circuitry 1002, and clock tree 108 that changing signal MATCH_E to correspond to identification signal PC1 will cause signal STOPCLK to transition to logic zero prior to issue of the PCLK2L0_10 pulse 1112. In this event, only PCLK01 pulse 1111 will issue to circuitry 102.

Once pulse test clock mode is enabled by register 302 bit PULSE and signal DFMODE, pulse trains may be created in accordance with Table 4 during each BCLK cycle when trigger signal PCLKBYP is a logic one.

While the invention has been described with respect to the embodiments and variations set forth above, these embodiments and variations are illustrative and the invention is not to be considered limited in scope to these embodiments and variations. For example, it will be recognized that other circuitry may be used to implement the test clock modes and phase-locked loop. Furthermore, any combination of test clock modes may be used to, for example, test clocked circuitry including processor circuitry. Register 302 may be any read/write memory Accordingly, various other embodiments and modifications and improvements not described herein may be within the spirit and scope of the present invention, as defined by the following claims.

What is claimed is:

1. An electronic system having integrated circuitry comprising:
   a phase-locked loop to provide an output signal phase locked to a reference clock signal; and
   test clock mode circuitry coupled to the phase-locked loop to modify the phase-locked loop output signal according to a test clock mode.

2. The electronic system of claim 1 wherein the frequency of the output signal is a multiple of X times a frequency of the reference signal.

3. The electronic system as in claim 2 wherein X is three.

4. The electronic system of claim 1 wherein the test clock mode is one of the members of a group consisting of cycle stretching, stop, and pulse test clock modes, and the test clock mode circuitry comprises:
   cycle stretching mode circuitry to stretch selected phase-locked loop output signal cycles according to the cycle stretching test clock mode;
   stop mode circuitry to stop a phase-locked loop output signal pulse train according to the stop test clock mode; and
   pulse mode circuitry to provide selected phase-locked loop output signal pulse trains according to the pulse test clock mode.

5. The electronic system of claim 4 further comprising:
   a memory, coupled to the test clock mode circuitry, the memory having test clock mode selection data stored therein to select one of the members of the group as the test clock mode and to designate a particular phase-locked loop output signal cycle to initiate a selected test clock mode.

6. The electronic system of claim 1 wherein the test clock mode is one of the members of a group consisting of cycle stretching, stop, and pulse test clock modes, the electronic system further comprising:
   a processor, wherein the processor includes the phased-locked loop, the test clock mode circuitry, and additional circuitry coupled to the phase-locked loop to receive the phase-locked loop output signal;
   a memory to store data to select one of the members of the group as the test clock mode; and
   a bus coupling the processor to the memory.

7. An integrated circuit comprising:
   circuitry to receive data to select one of a plurality of test clock modes, wherein the test clock modes include a cycle stretch test clock mode, a stop test clock mode, and a pulse test clock mode;
   a phase-locked loop having an output signal;
   a first circuit to modify the output signal by stretching a predetermined group of phase-locked loop output signal cycles in accordance with the cycle stretch test clock mode when the data selects a cycle stretch test clock mode;
   a second circuit to modify the output signal by stopping phase-locked loop output signals at a predetermined cycle in accordance with the stop test clock mode when the data selects a stop test clock mode; and
   a third circuit to modify cycles of the output signal into a predetermined pattern of phase-locked loop output signals in accordance with the pulse test clock mode when the data selects a pulse test clock mode.

8. The integrated circuit as in claim 7 wherein the circuitry is a register.

9. The integrated circuit as in claim 7 wherein the integrated circuit includes a processor.

10. A method comprising the steps of:
    selecting at least one of a plurality of test clock modes;
    modifying an output signal of a phase-locked loop in accordance with the selected test clock mode(s); and
    providing the modified phase-locked loop output signal to circuitry in a processor.

11. The method as in claim 10 further comprising steps of:
    loading a memory in a processor with one of the selected test clock modes; and
    enabling test clock mode circuitry coupled to the phase-locked loop to modify the output signal of the phase-locked loop in accordance with contents of the loaded memory.

12. The method as in claim 10 further comprising step of:
    receiving data representing the selection of the test clock mode(s).

13. The method as in claim 10 further comprising the step of:
    selecting a cycle of the phase-locked loop;
    wherein the step of modifying the phase-locked loop output signal comprises the step of:
    stopping the phase-locked loop output signal at the selected cycle of the phase look loop.

14. The method as in claim 10 further comprising the step of:
    selecting a pulse of the phase-locked loop output signal;
    wherein the step of modifying the phase-locked loop output signal comprises the step of:
    providing a train of output signal pulses of the phase-locked loop that begin with a predetermined pulse and end with the selected pulse.

15. The method as in claim 10 further comprising the step of:

selecting a cycle of the phase-locked loop;

wherein the step of modifying the phase-locked loop output signal comprises the step of:

stretching pulses of the phase-locked loop output signal beginning with the selected cycle of the phase-locked loop.

16. The method as in claim 15 further comprising the step of:

maintaining phase lock between the phase-locked loop output signal and a reference signal during the step of stretching.

17. The method as in claim 15 wherein the step of selecting a cycle of the phase-locked loop comprises the step of:

providing a trigger signal to test clock mode circuitry.

18. A method comprising the steps of:

providing to circuitry in a processor a first signal of a processor in a phase-locked relationship with a reference signal;

providing data to circuitry, wherein the data indicates one of a plurality of particular clock modes for activation;

selecting a particular cycle of the first signal;

applying an activated trigger signal to the circuitry;

activating a selected clock mode during activation of the applied trigger signal; and modifying the first signal in accordance with the provided data upon activation of the clock mode and upon selecting the particular first signal cycle.

19. The method as in claim 18 wherein the plurality of clock modes includes cycle stretch mode, pulse mode, and stop mode.

20. The method as in claim 18 wherein when the selected mode is a pulse mode, the step of activating a selected clock mode comprises the steps of:

providing an output signal path corresponding to the modified first signal; and providing a feedback signal path for a signal corresponding to an unmodified first signal, wherein the fed back signal is in a phase-locked relationship with the reference signal.

21. The method as in claim 18 wherein the reference signal corresponds to a signal applied externally to the processor.

22. The method as in claim 18 wherein the first signal has a frequency X times a frequency of the reference signal, and the step of selecting a particular cycle of the first signal comprises the steps of:

generating X cycle state identification signals, wherein each of the X cycle state identification signals has a frequency equal to the reference signal frequency, is periodic, and has pulses corresponding to a unique set of pulses of the first signal; and selecting one of the generated X cycle state identification signals; and wherein the step of activating a selected clock mode comprises the step of:

activating the selected clock mode with a pulse from the selected one of the generated X cycle state identification signals during activation of the applied trigger signal.

23. The method as in claim 18 wherein when the selected mode is a cycle stretch mode, the method further comprising the step of:

increasing the period of the reference signal by X; and wherein the step of modifying the first signal comprises the steps of:

stretching N cycles of the first signal by a factor of X during the increased period of the reference signal.

24. The method as in claim 23 wherein N is three and X is two.

* * * * *